United States Patent [19]
Ida et al.

[11] Patent Number: 6,127,205
[45] Date of Patent: *Oct. 3, 2000

[54] PROCESS FOR MANUFACTURING A MOLDED ELECTRONIC COMPONENT HAVING PRE-PLATED LEAD TERMINALS

[75] Inventors: Yoshio Ida; Akiyoshi Tainaka, both of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/901,239

[22] Filed: Jul. 25, 1997

[30] Foreign Application Priority Data

Jul. 26, 1996 [JP] Japan .................................. 8-197901

[51] Int. Cl.[7] .......................... H01L 21/44; H01L 21/48; H01L 21/50
[52] U.S. Cl. ............................. 438/111; 438/112; 438/123
[58] Field of Search ..................... 438/111, 112, 438/902, 907, 123; 428/620; 205/103

[56] References Cited

U.S. PATENT DOCUMENTS

| | | |
|---|---|---|
| 3,650,232 | 3/1972 | Heinlen . |
| 3,660,251 | 5/1972 | Fluhmann et al. . |
| 3,929,593 | 12/1975 | Sugiyama et al. . |
| 3,983,014 | 9/1976 | Newman et al. . |
| 4,571,287 | 2/1986 | Okubo et al. . |
| 4,589,962 | 5/1986 | Sajja et al. . |
| 4,666,567 | 5/1987 | Loch . |

FOREIGN PATENT DOCUMENTS

| | | |
|---|---|---|
| 61-52388 | 3/1986 | Japan . |
| 62-151592 | 7/1987 | Japan . |
| 63-95698 | 4/1988 | Japan . |

OTHER PUBLICATIONS

Patent Abstracts of Japan, vol. 14, No. 566 (C–0789), Dec. 17, 1990.
Patent Abstracts of Japan, vol. 95, No. 11, Dec. 26, 1995.
Tijdschrift Voor Oppervlaktetechinieken van Materialen, vol. 29, No. 2, Feb. 1985, pp. 44–47.

*Primary Examiner*—David E. Graybill
*Attorney, Agent, or Firm*—Sughrue, Mion, Zinn, Macpeak & Seas, PLLC

[57] ABSTRACT

A process for manufacturing a molded elecronic component such as a solid electrolyte capacitor comprising a capacitor element including a cathode layer, an anode lead, a pre-plated anode lead terminal connected to the anode lead, a pre-plated cathode lead terminal connected to the cathode layer, and an insulating member which encapsulates the capacitor element and leaves a portion of the anode and cathode lead terminals exposed. The encapsulated portions of the pre-plated anode and cathode lead terminals have a plating layer formed thereon containing organic substances in an amount of 0.03 wt. % or less.

14 Claims, 6 Drawing Sheets

PROCESS FOR MANUFACTURING A MOLDED ELECTRONIC COMPONENT HAVING PRE-PLATED LEAD TERMINALS

BACKGROUND OF THE INVENTION

1. Field of the Invention

The present invention relates to a resin-molded electronic component having lead terminals, and more particularly, to a chip type solid electrolyte capacitor having solder plated lead terminals, and a process for manufacturing the same.

2. Description of the Related Art

As the weight and size of electronic equipment is progressively reduced, and as surface mounting technology has advanced, the chip type component such as a solid electrolyte capacitor featuring a small size and high capacity has enjoyed an increasingly expanded market scale and is used in various applications.

Conventionally, as shown in FIG. 8, a chip type solid electrolyte capacitor has a capacitor element 1 having a cathode layer 3, an anode lead 2, an anode lead terminal 8 connected to the anode lead 2 by welding or the like, and a cathode lead terminal 9 connected to the cathode layer 3.

Moreover, the cathode layer 3 and the cathode lead terminal 9 are connected by a conductive adhesive 10 such as silver paste. The capacitor is packaged by resin 6, leaving portions of the anode and cathode lead terminals 8 and 9 exposed. In addition, the anode and cathode lead terminals 8 and 9 are bent along the outer surface of the resin package 6. Since these lead terminals 8 and 9 are pre-plated with a plating layer of solder or the like by a direct current plating method using a linear current waveform as shown in FIG. 9, it has the following disadvantages (1) and (2).

(1) Organic components contained in a plating solution such as a brightener or dispersant are incorporated into the plating layer. As a result, the plating layer of solder or the like formed on the anode and cathode lead terminals 8 and 9 contains a considerable amount of the following organic substances.

Sample: Plating film formed by direct current plating
Detected components:
Dichlorotoluene,
N,N,2,6-tetramethylbenzeneamine,
trichlorobenzene,
chlorobenzenemethanol,
dichlorobenzaldehyde,
dichlorobenzenemethanol,
lauric acid methyl When such pre-plated lead terminals are employed in a resin-molded type electronic component, the organic substances in the plating layer of solder or the like are vaporized by thermal stress when mounting the component to generate a considerable amount of gas.

The gas thus generated in an adhering interface between the conductive adhesive 10 and the cathode lead terminal 9 affects connection reliability, and reduces the connection strength between the conductive adhesive 10 and the cathode lead terminal 9. In a worst case, the cathode lead terminal may peel off to result in an electrically open circuit.

(2) The plated solder on the lead terminals 8 and 9 in the resin package 6 tends to elute from the resin package to form a solder ball 7. This occurs when an excessive amount of an organic substance is generated due to thermal stress in mounting the electronic component. The resulting solder ball 7 can short circuit conductive patterns when the component is mounted on a printed circuit board.

To avoid the foregoing disadvantages, it is possible to plate only the exposed portion of the lead terminals. But such selective plating increases production cost.

SUMMARY OF THE INVENTION

It is therefore an object of the present invention to provide an electronic component such as a solid electrolyte capacitor which maintains good connection reliability at its connecting portion using conductive adhesive and prevents the generation of a solder ball, and a process for manufacturing the same without resorting to a selective plating method.

The above objective of the present invention is achieved by employing electroplated lead terminals which contain organic substances in an amount of 0.03 wt % or less. In the case of a solid electrolyte capacitor, a pre-plated anode lead terminal is welded to an anode lead of a capacitor element and pre-plated cathode lead terminal is connected to a cathode layer of the capacitor element by using a conductive adhesive. The capacitor element is encapsulated by an insulating member so as to leave a portion of anode and cathode lead terminals exposed. Both of the encapsulated and exposed portions of the pre-plated anode and cathode lead terminals have a pre-plated layer containing organic substances in an amount of 0.03 wt. % or less.

Such a small amount of the organic substances in the electroplated layer can be achieved by using a special pulse plating method with a current waveform having a counter pulse. ON time and OFF time of the current waveform is selected to be about 10 to 500 msec and the OFF time includes a counter (negative) current pulse which has an amplitude that is from ½ to ¹⁄₅₀ that of the ON time pulse and a duration of 2 to 20 msec.

DETAILED DESCRIPTION OF THE INVENTION

Figure 1:
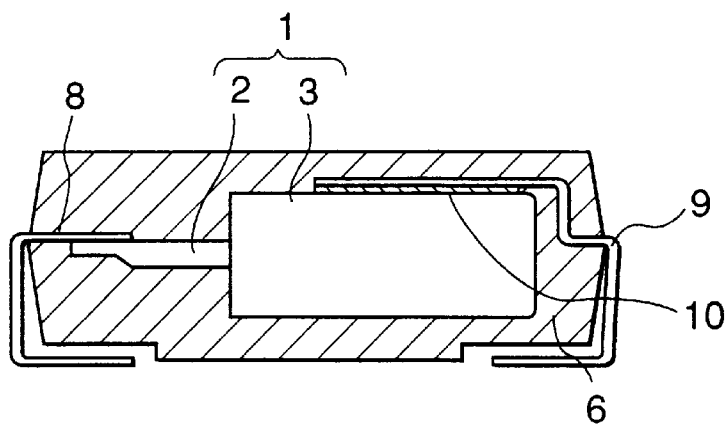
FIG. 1 is a side cross sectional view of a chip type solid electrolyte capacitor according to an embodiment of the present invention.
Figure 2A:
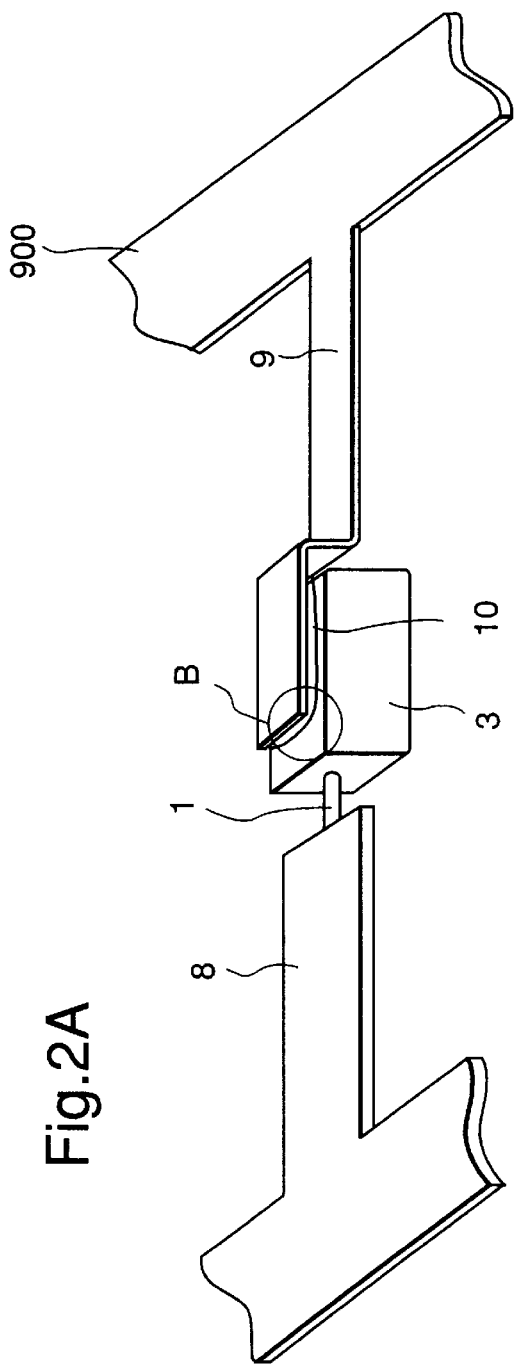
FIG. 2A is a perspective view of a chip type solid electrolyte capacitor assembled in a lead frame prior to a molding prosess.

Referring to FIG. 1, an anode body of a valve metal such as tantalum is subjected to anodic oxidation and a solid electrolyte layer such as manganese oxide layer, a carbon layer and a silver paste layer are formed thereon sequentially. As a result, a solid electrolyte capacitor element 1 having a cathode layer 3 in the outer-most layer is formed. As shown in FIG. 2A, anode lead 2 embedded in this capacitor element 1 and a pre-plated anode lead terminal 8 are connected together by means of welding or the like. A pre-plated cathode lead terminal 9 is connected to the cathode layer 3 via a conductive adhesive 10. The assembly is thereafter encapsulated with an electrically insulating member 6 such as epoxy resin by means of a transfer molding process such that a portion of each of the anode and cathode lead terminals 8 and 9 is exposed.

Figure 2B:
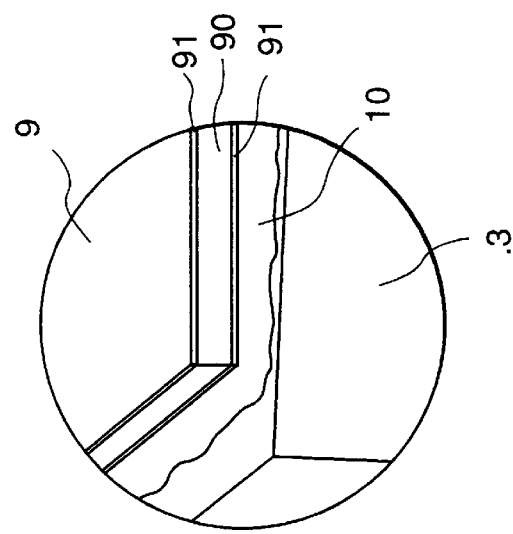
FIG. 2B is an enlarged perspective view showing a main part B shown in FIG. 2A.

Since a lead frame 900 is punched out from a solder-plated metal tape (not shown), lead terminals 8 and 9 are provided with a top solder plating layer 91 and bottom solder plating layer 92 and side edges thereof are not plated as shown in FIG. 2B. Needless to say, solder plating may be carried out for the lead frame after punching out from a non-plated metal tape. In that case, whole surfaces of the lead frame are coated with a plating layer.

Figure 3:
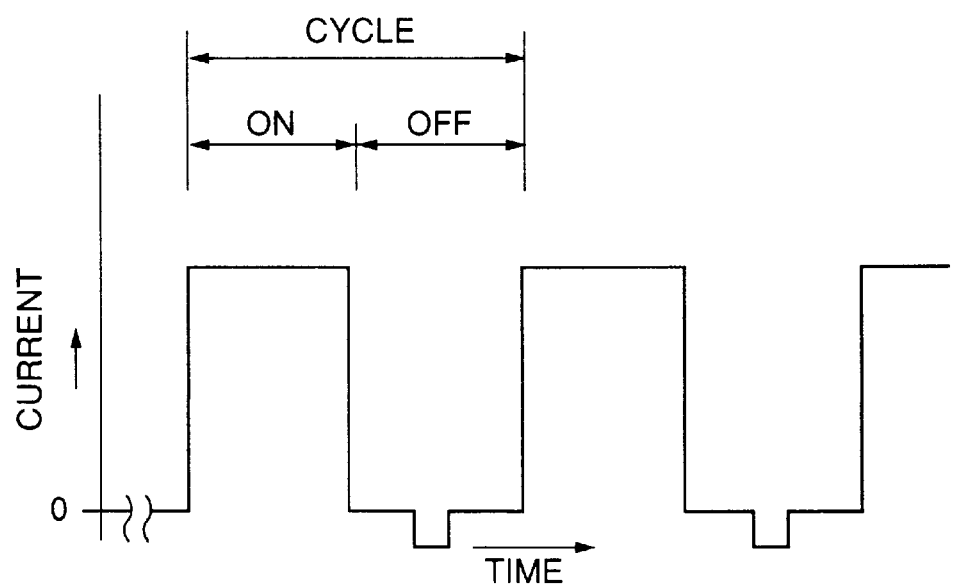
FIG. 3 is a waveform diagram showing an example of the current waveform used in the pulse plating method of the present invention.

The solder plating layer of the present invention is formed using a pulse plating method with a current waveform having an ON time of from about 10 to about 500 msec including a positive current pulse and an OFF time of from about 10 msec to about 500 msec including a negative current pulse as shown in FIG. 3. The negative current pulse (counter pulse) has an amplitude that is from ½–⅟₅₀ that of the positive current pulse and a duration of from 2 to 20 msec. Other than the counter pulse, preferably, there is no current flow during the OFF portion of the waveform. The timing of the negative current pulse is not restricted to the position shown in FIG. 3, but may be at any position between adjacent positive current pulses.

Figure 4:
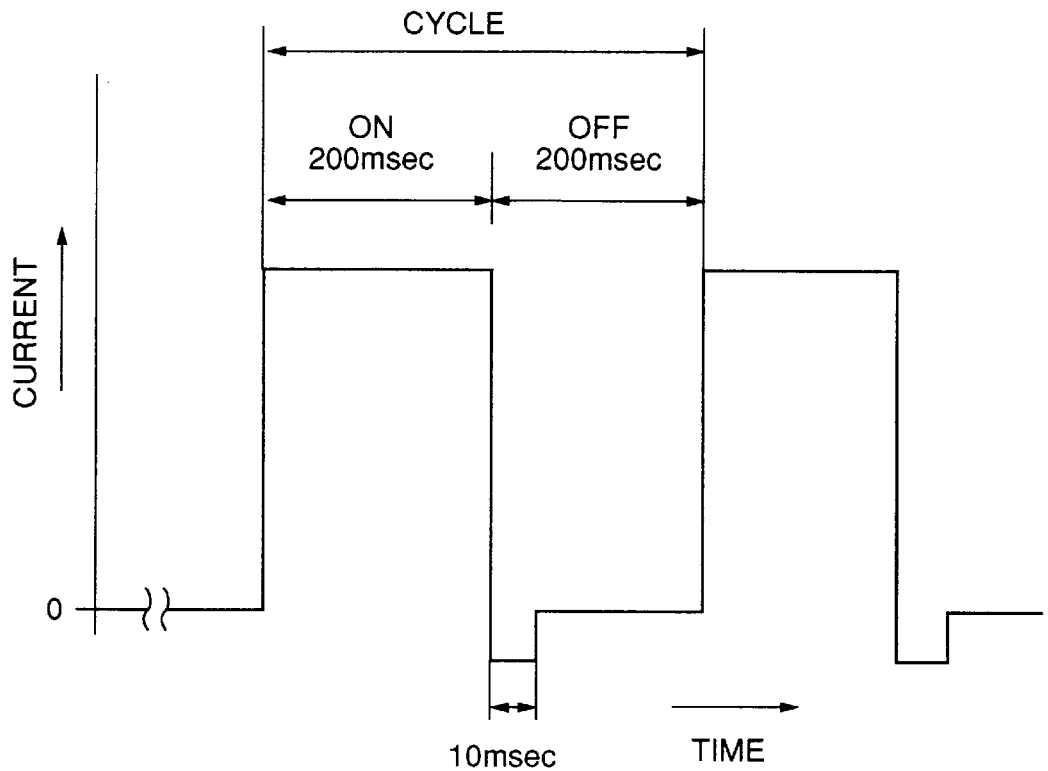
FIG. 4 is a waveform diagram showing an example of the current waveform used in a preferred embodiment of the present invention.

In a preferred embodiment, the current waveform has an ON time (positive pulse) of 200 msec and an OFF time of 200 msec including a 10 msec negative pulse at the trailing edge of the positive pulse as shown in FIG. 4. The amplitude of the negative pulse is selected to be ⅟₁₀ of the positive pulse. The pulse plating method of the present invention reduces the amount of organic substances (e.g., dispersant and/or brightener) from the solder plating layer having a thickness of about 4 μm.

Figure 5:
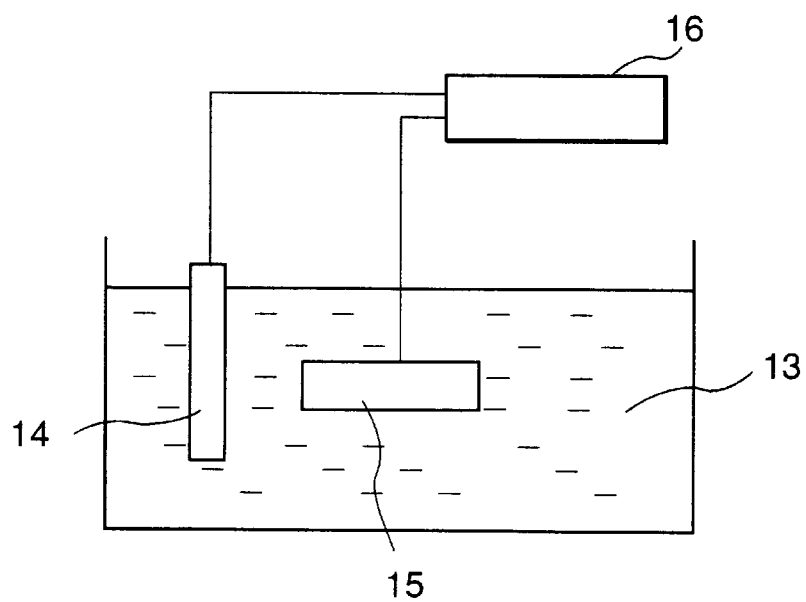
FIG. 5 is a diagram of a plating apparatus for use in present invention.

A well known plating apparatus can be used for this invention as shown in FIG. 5, including plating bath 13, electrode 14, lead terminal base metal 15 and current source 16. When positive and negative pulses are applied to the electrode 14, the base metal 15 may be grounded. The electrode 14 is made of Pb/Sn alloy and the solder plating bath contains 10 to 60 vol. % of $Sn(BF_4)_2$, 1 to 40 vol. % of $Pb(BF_4)_2$, 10 to 70 vol. % of $HBF_4$ and 1 to 20 vol. % of additives. The base metal 15 is made of well known 42-alloy which is widely used for lead terminals of electronic components. Needless to say, the solder plating bath is not restricted to the above described solution, for example, the solder plating solution disclosed in U.S. Pat. No. 4,589,962 may be used.

Figure 6:
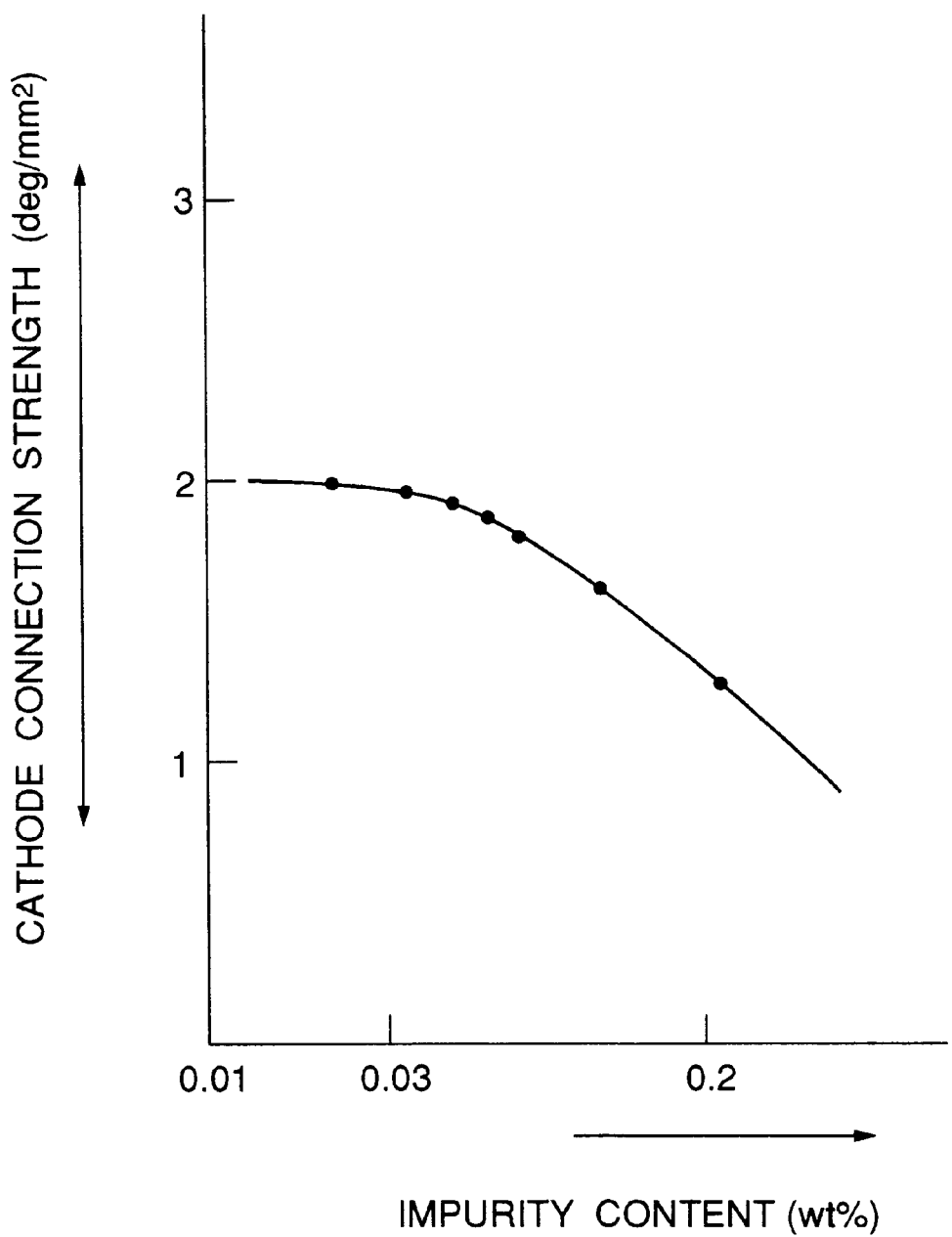
FIG. 6 is a graph correlating impurity content of the plating layer and cathode connection strength.

The connection strength between the cathode layer 3 and the cathode lead terminal 9 of the chip type solid electrolyte capacitor thus prepared prior to forming the external package was evaluated. The present inventors found, as shown in FIG. 6, that the connection strength in the present invention was about 1.5 times that of a conventional device. The fluctuation in connection strength was also reduced by 20% or more.

In addition, the product was conveyed into a heat furnace after the external package was formed to apply thermal stress thereon and inspected for solder ball generation. It was found that solder balls were generated 75% of the time (75% solder ball generation rate) when the cathode lead terminal had a solder layer thereon formed using a conventional direct current plating method, while no solder balls were generated in making the solid electrolyte capacitor of the present invention.

Figure 7:
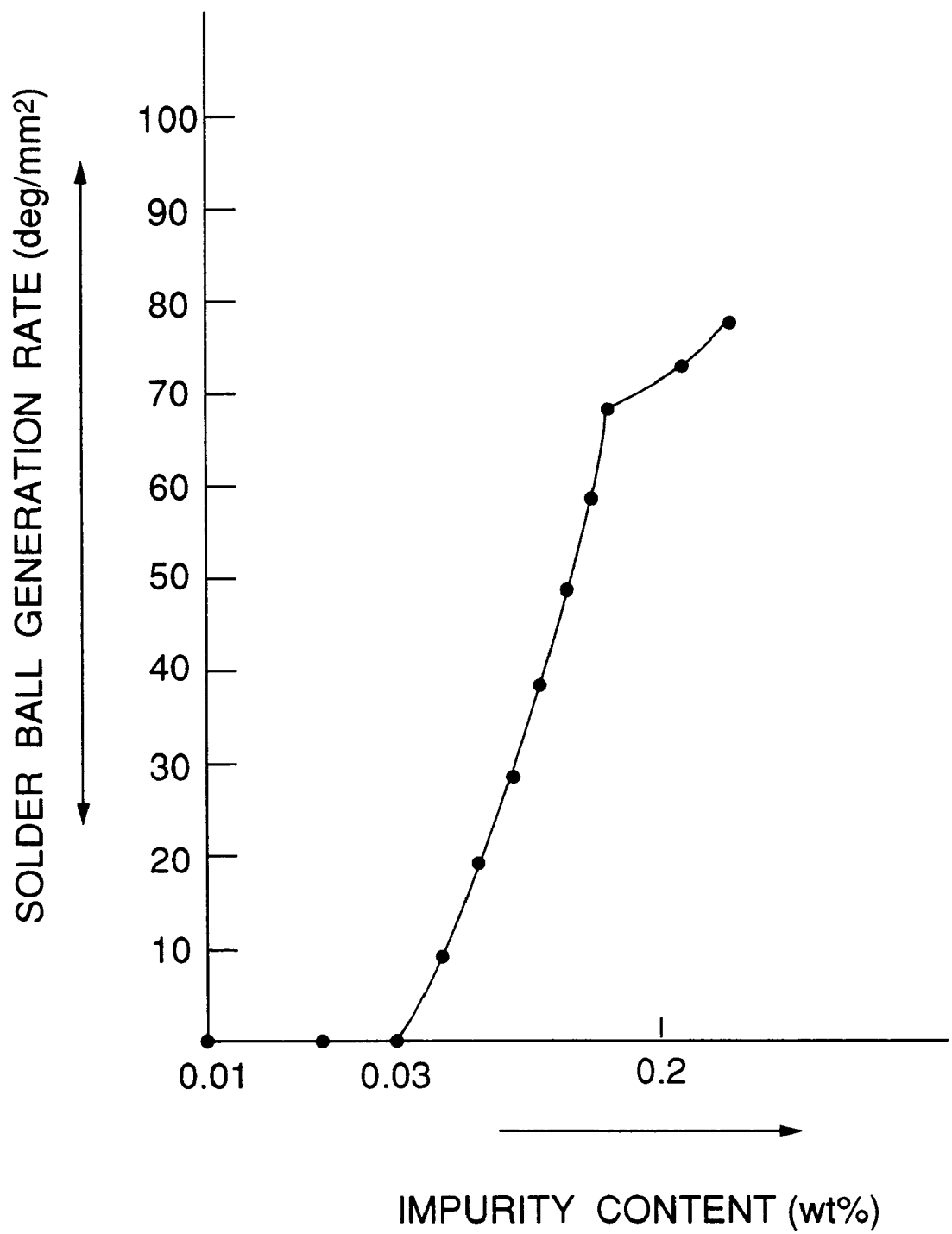
FIG. 7 is a graph showing the rate of solder ball generation as a function of impurity content.
Figure 8:
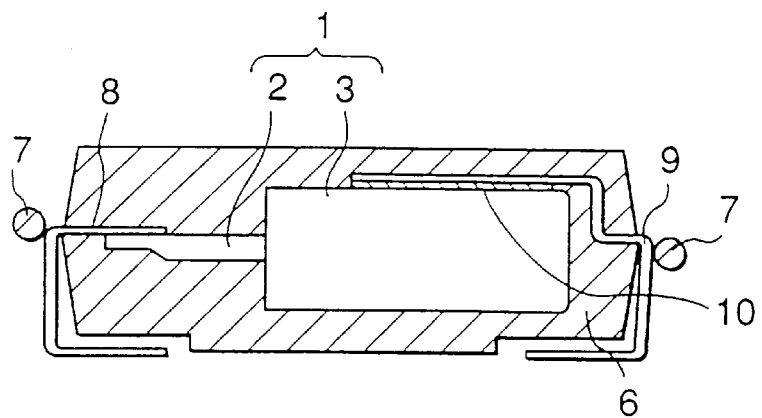
FIG. 8 is a side cross sectional view of an example of a conventional chip type solid electrolyte capacitor.
Figure 9:
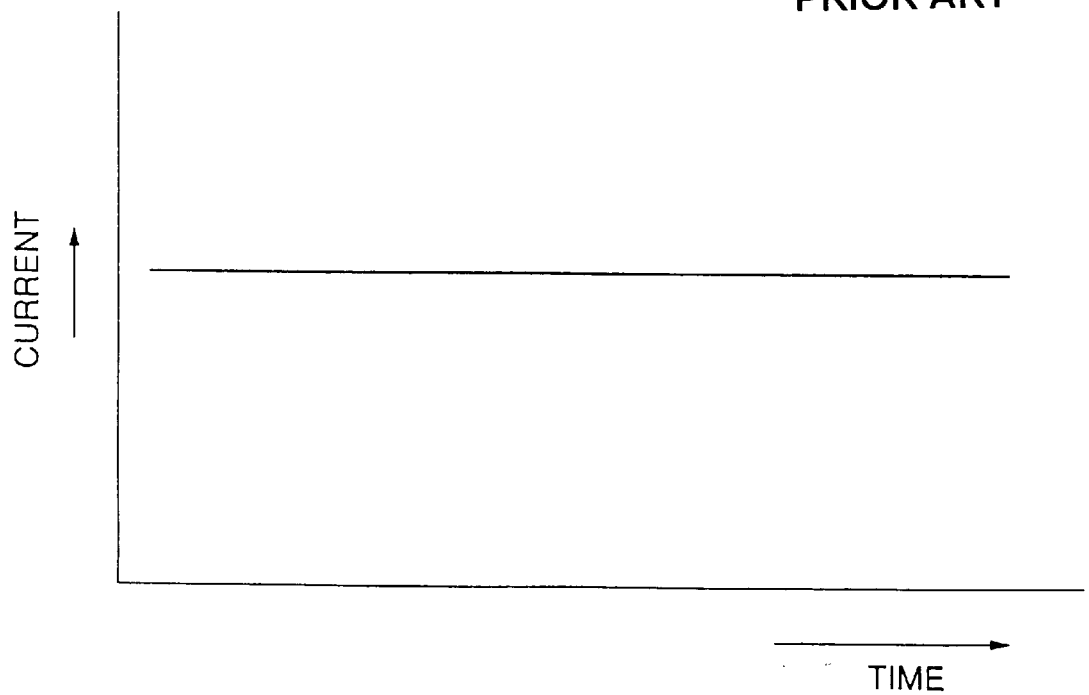
FIG. 9 is a waveform diagram showing an example of the current waveform used in a conventional direct current plating method.

Furthermore, as clearly seen from the relationship between the cathode connection strength and the impurity content (wt. %) as shown in FIG. 7, the present inventors found that solder balls substantially do not form when the organic substance (impurity) content in the solder plating layer is 0.03 wt. % or less.

This effect is obtained by providing a plating layer on all of the surfaces of the anode and cathode lead terminals or by providing only upper plating layer 91 of the anode and cathode lead terminals 8 and 9, which surface is subsequently soldered to a printed wiring board.

The content of organic substances (impurities) contained in a plating layer formed on the anode and cathode lead terminals in a conventional direct current plating method is about 0.2 wt. %. On the other hand, in the pulse plating method of the present invention, the impurity content can be reduced when the component is subjected to thermal mounting stress and a solder ball is not formed.

Although a simple pulse plating method is known to provide a uniform plating layer. For example, Japanese Patent Application Laid-Open No. 62-151592 shows to apply a pulsative current of 1 msec ON time and 25–35 msec OFF time to plating electrodes to form a defectless noble metal plating layer. However, since the ON time is very short and no counter pulse is provided during the OFF time, plating layer still contains organic substances in an amount of 0.05 wt. %–0.08 wt. %.

On the other hand, Japanese Patent Application Laid-Open No. 63-95698 shows a solder plating method for obtaining a uniform plated solder layer on both of conductive circuit pattern and throughhole of a mulilayer printed wiring board. Although a counter pulse is applied to the plating electrodes, there is no mention about the organic substances in the plating layer. Since the pulse width is selected to be 4.0 msec or less without OFF time and both of the positive and negative pulses have the same amplitude, it is unknown whether the amount of the organic substances in the plating layer is less than 0.03 wt. % or not. Even if the amount of the organic substances could be less than 0.03 wt. %, it does not anticipate the present invention because the Japanese Patent Application Laid-Open No. 63-95698 does not mention about the solid electrolyte capacitor and its solder plated lead terminals connected to the cathode layer by using a conductive adhesive, much less the problems of generation of gas and solder ball which is peculiar to the molded-type electronic components having a pre-plated lead terminals passing through the molded package thereof.

As described above, the following advantages are realized by plating the anode and cathode lead terminals with a layer of solder or the like using the pulse plating method of the present invention.

(1) Because organic substances such as a brightener and/or dispersant normally contained in the plating solution are not incorporated into the plating layer, differing from the case where solder is plated by a direct current plating method, the plating layer formed on the anode and cathode lead terminals has a low organic substance content. Thus, hardly any gas is generated in the adhering interface between the conductive adhesive and the cathode lead terminal due to thermal stress when mounting the finished electronic component. As a result, the connection reliabilty is enhanced.

(2) In addition, it is possible to eliminate the problem of solder ball generation.

It should further be apparent to those skilled in the art that various changes in form and detail of the invention as shown and described above may be made. It is intended that such changes be included within the spirit and scope of the claims appended hereto.

What is claimed is:

1. A process for manufacturing a molded electronic component comprising:
   forming lead terminals having a plating layer containing organic substances in an amount of 0.03 wt. % or less, said step of forming lead terminals having a plating layer comprising pulse plating with a current waveform having a counter pulse;
   providing an electronic element having electrodes; electrically connecting said lead terminals having a plating layer to electrodes of said electronic element; and
   encapsulating said electronic element while leaving a portion of said lead terminal having a plating layer exposed.

2. The process for manufacturing a molded electronic component as claimed in claim 1, wherein said current waveform has an ON time of from about 10 to about 500 msec including a positive current pulse, an OFF time of from about 10 msec to about 500 msec including a negative current pulse, and the counter pulse is a negative current pulse having an amplitude that is from ½–⅕₀ that of the positive current pulse and a duration of from 2 to 20 msec.

3. The process for manufacturing a molded electronic component as claimed in claim 1, wherein said step of forming lead terminals having a plating layer comprises providing an electrolytic plating bath and a pulsating current source, immersing said lead terminal base metal in said plating bath, and passing a pulsating current having a counter pulse through said plating bath.

4. The process for manufacturing a molded electronic component as claimed in claim 1, wherein said step of forming lead terminals having a plating layer comprises plating a metal sheet and punching the metal sheet to obtain pre-plated lead terminals having a plating layer present only on an upper surface and a lower surface of said lead terminals.

5. The process for manufacturing a molded component as claimed in claim 1, wherein said current waveform has a counter pulse which has an ON time and an OFF time including a counter current pulse.

6. The process for manufacturing a molded electronic component as claimed in claim 5, wherein said counter current pulse has an amplitude that is from ½ to ⅕₀ that of said ON time pulse and a duration of from 2 to 20 msec.

7. A process for manufacturing a molded electronic component comprising:
   forming lead terminals having a plating layer, which step of forming lead terminals having a plating layer comprises pulse plating with a current waveform having a counter pulse, wherein said current waveform has an ON time of from about 10 to about 500 msec including a positive current pulse, an OFF time from 10 msec to 500 msec including a negative current pulse, and the counter pulse is a negative current pulse having an amplitude that is from ½–⅕₀ that of the positive current pulse and a duration of from 2 to 20 msec.

8. The process for manufacturing a molded electronic component as claimed in claim 2, wherein there is no current flowing during the OFF portion of the waveform other than during the negative counter pulse.

9. The process for manufacturing a molded electronic component as claimed in claim 1, wherein the plating layer has a thickness of about 4 $\mu$m.

10. The process for manufacturing a molded electronic component as claimed in claim 1, wherein said plating layer is a solder plating layer, and said step of forming lead terminals having a plating layer comprises providing an electrolytic plating bath and a pulsating current source, immersing said lead terminal base metal in said plating bath, and passing a pulsating current having a counter pulse through said plating bath,
    wherein said plating bath comprises 10 to 60 vol. % of Sn $(BF_4)_2$, 1 to 40 vol. % of Pb $(BF_4)_2$, 10 to 70 vol. % of $HBF_4$ and 1 to 20 vol. % of additives.

11. The process for manufacturing a molded electronic component as claimed in claim 7, wherein there is no current flow during the OFF portion of the waveform other than during the negative counter pulse.

12. The process for manufacturing a molded electronic component as claimed in claim 7, wherein said plating layer has a thickness of about 4 $\mu$m.

13. The process for manufacturing a molded electronic component as claimed in claim 7, wherein said plating layer is a solder plating layer, said step of forming lead terminals having a plating layer comprises providing an electrolytic plating bath and a pulsating current source, immersing said lead terminal base metal in said plating bath, and passing a pulsating current having a counter pulse through said plating bath,
    wherein said plating bath comprises 10 to 60 vol. % of Sn $(BF_4)_2$, 1 to 40 vol. % of Pb $(BF_4)_2$, 10 to 70 vol. % of $HBF_4$ and 1 to 20 vol. % of additives.

14. A process for manufacturing a molded electronic component comprising:
    forming lead terminals having a plating layer containing organic substances in an amount of 0.03 wt. % or less, said step of forming lead terminals having a plating layer comprising pulse plating with a current waveform having a current pulse, wherein said current waveform has an ON time of from about 10 to about 500 msec including a positive current pulse, an OFF time of from 10 msec to 500 msec including a negative current pulse, and the counter pulse is a negative current pulse having an amplitude that is from ½–⅕₀ that of the positive current pulse and a duration of from 2 to 20 msec;
    providing an electronic element having electrodes; electrically connecting said lead terminals having a plating layer to electrodes of said electronic element; and encapsulating said electronic element while leaving a portion of said lead terminal having a plating layer exposed,
    wherein there is no current flow during the OFF portion of the waveform other than during the negative counter pulse, and said stop of forming lead terminals having a plating layer further comprising providing an electrolytic plating bath and a pulsating current source, immersing said lead terminal base metal in said plating bath, and passing a pulsating current having a counter pulse through said plating bath,
    wherein said plating bath comprises 10 to 60 vol. % of Sn $(BF_4)_2$, 1 to 40 vol. % of Pb $(BF_4)_2$, 10 to 70 vol. % of $HBF_4$ and 1 to 20 vol. % of additives.

* * * * *